US005541527A

United States Patent [19]

Hae-Ting Ma

[11] Patent Number: 5,541,527
[45] Date of Patent: Jul. 30, 1996

[54] PECL BUFFER

[75] Inventor: Herman Hae-Ting Ma, Dallas, Tex.

[73] Assignee: SGS-Thomson Microelectronics, Inc., Carrollton, Tex.

[21] Appl. No.: 551,127

[22] Filed: Oct. 31, 1995

[51] Int. Cl.$^6$ .................................................. H03K 17/16
[52] U.S. Cl. ............................ 326/21; 326/121; 327/171
[58] Field of Search ........................ 326/21, 121; 327/171, 327/239, 258–259, 295, 916

[56] References Cited

U.S. PATENT DOCUMENTS

| 4,283,639 | 8/1981 | Roesler | 327/171 |
| 5,047,659 | 9/1991 | Ulrich | 327/171 |
| 5,130,566 | 7/1992 | Nguyen | 327/171 |
| 5,140,174 | 9/1992 | Meier | 327/171 |

*Primary Examiner*—Edward P. Westin
*Assistant Examiner*—Andrew Sanders
*Attorney, Agent, or Firm*—Renee M. Larson; Lisa K. Jorgenson

[57] ABSTRACT

A PECL buffer produces a PECL differential signal pair given a single-ended input signal. The buffer does not introduce any phase mismatch and thus no skew to the differential signal pair. Because no phase mismatch exists between the differential signal pair, the present invention is especially suited for high speed systems and circuits. The buffer also allows the differential signal pair to respond continuously to changes in the single-ended input signal.

18 Claims, 1 Drawing Sheet

PECL BUFFER

BACKGROUND OF THE INVENTION

1. Field of the Invention

The present invention relates generally to buffers, and more specifically to PECL buffers.

2. Description of the Prior Art

Many circuits and systems employ small voltage swings in order to speed up system operation and decrease power consumption. For instance, using CMOS voltage levels, a small voltage swing from 3.9 volts to 1.2 volts may be accomplished much more quickly than a larger swing from 5 volts to 0 volts. A system or circuit employing a single-ended voltage swing, as opposed to a differential pair voltage swing, may be very fast but lack needed signal drive. For this reason, a differential pair buffer may be used to convert the single-ended signal to a differential signal pair in order to boost the drive, thereby obtaining even faster system or circuit operation. A PECL signal pair is thus required in applications where a high speed clock rate or data rate is necessary. The PECL signal pair is usually a differential signal pair with a small voltage signal swing between two positive signals. For example, if the power supply is 5 volts, the PECL signal may swing from 3.9 volts to 1.2 volts.

Usually BiCMOS (Bipolar Complementary Metal Oxide Semiconductor) buffers are used to achieve a small differential voltage swing of high speed data or clock signals, with a differential clock or data signal pair known as PECL (Pseudo Emitter Common Logic) signals, but the costs associated with BiCMOS buffers at high frequencies are well known in the art. Thus, CMOS or NMOS technology is attractive as an alternative to BiCMOS technology, because CMOS or NMOS technology may be directly connected to the differential clock or data signal pair thereby further increasing system or circuit operation. For example, in the frequency range of approximately 150 MHz and greater, a CMOS process provides cost effectiveness and is often used.

In converting a single-ended signal to a differential signal pair, it is important that the differential signals be matched in terms of phase, or signal integrity will suffer. If the differential signals are out of phase, skew is introduced to the system causing the system speed to suffer. The transistor threshold voltage, $V_T$, of CMOS or NMOS transistors can affect the duty cycle of the PECL differential pair buffer and thus has a direct impact on the amount of skew that exists between the PECL differential pair. When the input voltage is swinging from a first voltage to a second voltage, for instance, the differential pair signal is not continuous until the input voltage rises above the threshold voltage $V_T$ of the transistor. In this way, skew occurs between the differential pair.

It is important that the PECL output buffer differential signal pair be matched in terms of phase so that signal skew is minimized and high speed operation is accomplished. For instance, consider a 166 MHz system having a 6 nS period. In a 50% duty cycle, 3 nS is allocated to the high portion of the cycle while 3 nS is allocated to the low portion of the cycle. If 1 nS is required for both rise and fall times, the signal is effectively available for only 1 nS. Thus, skew can not exceed 1 nS or there will be no differential pair signal at all. Furthermore, any skew will degrade the integrity of the PECL output buffer differential pair and slow down the differential signal pair. The 50% duty cycle is an example; the duty cycle of the incoming signal may or may not be equal to 50%.

Thus, there is an unmet need in the art to minimize, and preferably eliminate, phase mismatch between signals of a differential pair derived from an single-ended input signal such that skew is minimized and thus signal speed may be maximized. Reducing or eliminating skew between the differential signal pair will enable the circuit or system to achieve a higher speed of operation.

SUMMARY OF THE INVENTION

It would be advantageous in the art to be able to convert a single-ended signal to a differential signal pair with minimal loss of signal integrity.

It would be advantageous in the art to be able to convert a single-ended signal to a differential signal pair such that phase mismatch between the differential signal pair and thus skew between the differential signal pair is minimized.

Therefore, according to the present invention, a PECL buffer produces a PECL differential signal pair given a single-ended input signal. The buffer does not introduce any phase mismatch and thus no skew to the differential signal pair. Because no phase mismatch exists between the differential signal pair, the present invention is especially suited for high speed systems and circuits. The buffer also allows the differential signal pair to respond continuously to changes in the single-ended input signal.

The PECL buffer has an input stage, an equilibrium circuit, and an output stage. The input stage splits and then inverts the single-ended input signal to create a complementary pair of signals which are 180° out of phase with respect to one another. The equilibrium circuit establishes a mid-point between the threshold voltages of p-channel and n-channel transistors of the equilibrium circuit so that the differential pair of the output stage continuously respond to changes in the single-ended input signal. Because the transistors of the equilibrium circuit operate continuously and do not experience cut-off, the equilibrium circuit does not introduce phase mismatch and the differential signal pair remain 180° out of phase and thus no skew is introduced which could retard the speed of the differential signal pair in the output stage of the buffer circuit.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing(s), wherein:

DESCRIPTION OF THE INVENTION

Figure 1:
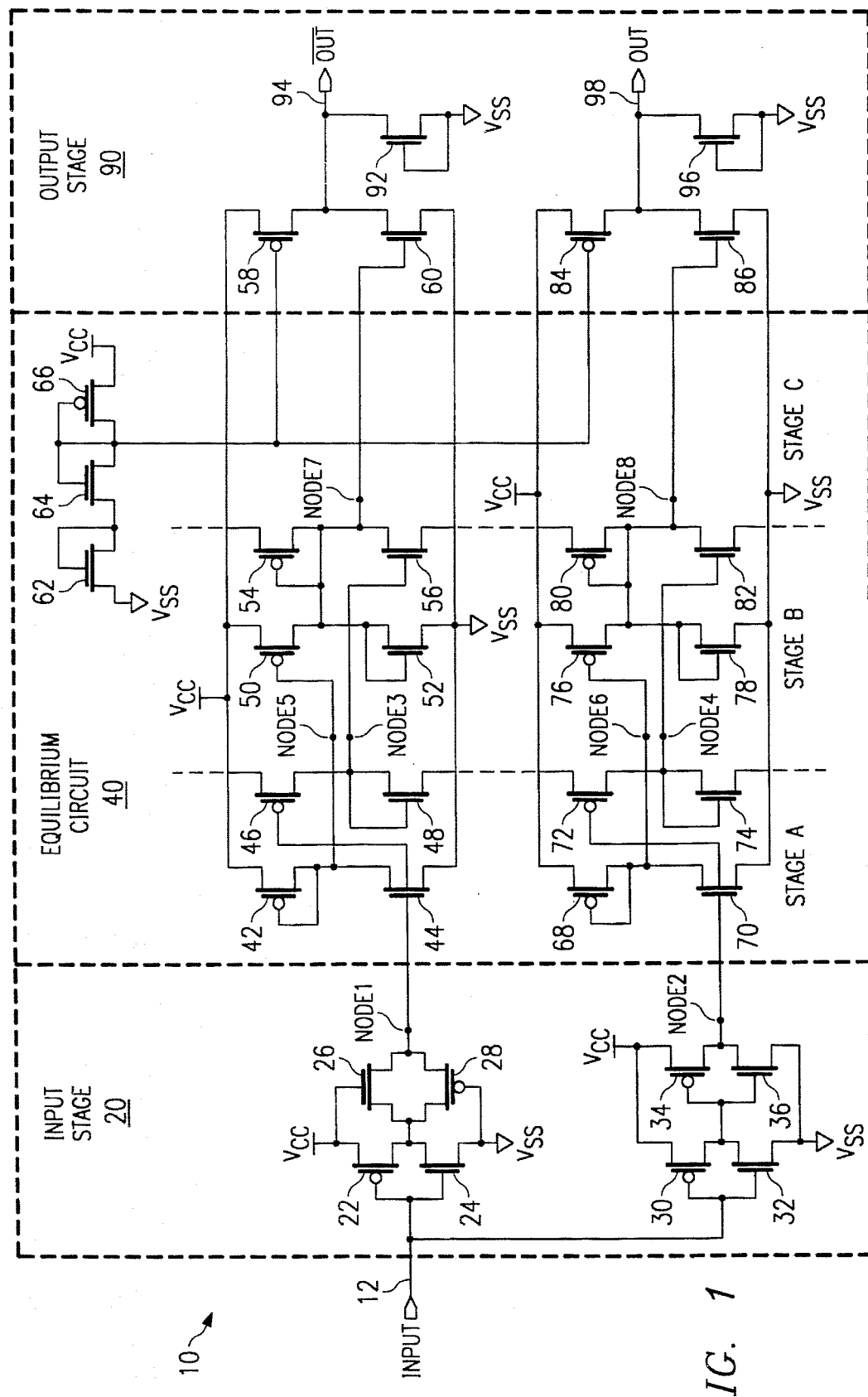
FIG. 1 is a PECL buffer circuit, according to a preferred embodiment of the present invention.

Referring to FIG. 1, a PECL buffer circuit 10, according to the present invention is shown. PECL buffer circuit 10 has an input stage 20, an equilibrium circuit 40, and an output stage 90 which produces Out bar signal 94 and Out signal 98. Input stage 20 has the following elements: n-channel transistors 24, 26, 32, and 36, and p-channel transistors 22, 28, 30, and 34. Input signal 12 is provided to the gates of transistors 22, 24, 30 and 32; as shown in FIG. 1, the gate of transistor 22 is connected to the gate of transistor 24, and the gate of transistor 30 is connected to the gate of transistor 32. A first source/drain of transistors 22, 30, and 34, and a gate of transistor 26 are connected to power supply Vcc. A second source/drain of transistors 24, 32, and 36, and a gate of transistor 28 are connected to voltage potential Vss, normally referred to as ground potential. A second source/drain of transistor 22 is connected to a first source/drain of transistor 24, a first source/drain of transistor 26, and a first source/drain of transistor 28. A gate of transistor 34 and a gate of transistor 36 are connected to a second source/drain of transistor 30 and a first source/drain of transistor 32. A second source/drain of transistor 26 is connected to a second source/drain of transistor 28 and to the gates of transistors 44 and 46 of equilibrium circuit 40 to define Node1. Node 2 is defined as the connection of a second source/drain of transistor 34, a first source/drain of transistor 36, and the gates of transistors 70 and 72 of equilibrium circuit 40.

Equilibrium circuit 40 is divided into three stages: Stage A, Stage B, and Stage C. Stage A has transistors 42, 44, 46, 48, 68, 70, 72, and 74 as elements. The elements of Stage B are transistors 50, 52, 54, 56, 76, 78, 80, and 82. Stage C includes Node7 and Node8. Output stage 90 includes transistors 58, 60, 62, 64, 66, 84, 86, 92, and 96. The gates of transistors 44 and 46 are provided the signal on Node1. Likewise, the gates of transistors 70 and 72 are provided the signal on Node2. A first source/drain of transistors 42, 46, 50, 54, 58, 68, 72, 76, 80, and 84, and a second source/drain of transistor 66 are connected to power supply Vcc. A first source/drain of transistor 62 and a second source/drain of transistors 44, 48, 52, 56, 60, 70, 74, 78, 82, and 86 are connected to voltage potential Vss. A second source/drain of transistor 42 is connected to a first source/drain of transistor 44, and a gate of transistor 50 to define Node5. A gate of transistor 48 is connected to a first source/drain of transistor 48, and a gate of transistor 56 to define Node3. A gate of transistor 52 is connected to a first source/drain of transistor 52, a second source/drain of transistor 50, a gate of transistor 54, a second source/drain of transistor 54, a first source/drain of transistor 56, and a gate of transistor 60 to define Node7. A gate of transistor 58 is connected to a gate of transistor 84, a second source/drain of transistor 64, a gate of transistor 64, a gate of transistor 66, and a first source/drain of transistor 66. A gate of transistor 62 is connected to a second source/drain of transistor 62 and a first source/drain of transistor 64.

Out bar signal 94 of output stage 90 is defined as the electrical connection of a second source/drain of transistor 58, a first source/drain of transistor 60, and a first source/drain of transistor 92 of output stage 90. A gate of transistor 92 and a second source/drain of transistor 92 are connected to voltage potential Vss. Out signal 98 of output stage 90 is defined as the electrical connection of a second source/drain of transistor 84, a first source/drain of transistor 86, and a first source/drain of transistor 96 of output stage 90. A gate of transistor 96 and a second source/drain of transistor 96 are connected to voltage potential Vss. Transistors 92 and 96 are protection devices of signals 94 and 98, respectively.

The gates of transistors 70 and 72 are provided the signal on Node2. A gate of transistor 68 is connected to a second source/drain of transistor 68, a first source/drain of transistor 70, and a gate of transistor 76 to define Node6. A second source/drain of transistor 72 is connected to a first source/drain of transistor 74, a gate of transistor 74, and a gate of transistor 82 to define Node4. A gate of transistor 78 is connected to a second source/drain of transistor 76, a first source/drain of transistor 78, a gate of transistor 80, a second source/drain of transistor 80, a first source/drain of transistor 82, and a gate of transistor 86 to define Node8.

The buffer circuit 10 provides many advantages over prior art differential signal pair circuitry. As previously mentioned, it is important that the differential signal pair experience no phase mismatch which would introduce skew between the signals of the differential signal pair and thus slow down operation. Buffer circuit 10 ensures that the signals of the differential signal pair 94 and 98 remain 180° out of phase such that no skew, which can slow down and degrade signal quality, is introduced and high speed operation is possible. Additionally, buffer circuit 10 ensures that the transistors do not cut-off, thereby allowing differential signal pair 94 and 98 to respond continuously to changes in single-ended input signal 12.

Referring again to FIG. 1, the circuitry of input stage 20 splits and then inverts incoming signal 12 to produce a complementary signal pair, represented as Node1 and Node2. Node1 and Node2, as complementary signals, are 180° out of phase. Equilibrium circuit 40 produces a midpoint in a voltage range between the threshold voltage of p-channel transistors, $V_{TP}$, and the threshold voltage of n-channel transistors, $V_{TN}$; thus the voltage swing will have a high of Vcc-$V_{TP}$ and a low of $V_{TN}$. The size of the voltage swing may be changed by adjusting the values of $V_{TP}$ and $V_{TN}$. There is no cut-off point for the p-channel and n-channel transistors and thus differential signal pair 94 and 98 are capable of continuously responding to single-ended input signal 12. Additionally, because Node3 and Node5 have the same threshold charge, the differential signal pair remain perfectly matched, 180° out of phase, such that no skew is introduced in equilibrium circuit 40 which might slow down the speed of the differential signal pair. Stage A of equilibrium circuit 40 causes either Node3 or Node5 to always be active because of the complementary p-channel and n-channel channel transistors 42, 44, 46, 48, and 68, 70, 72, 74, etc. Thus, stage A of equilibrium circuit 40 will always provide a signal to stage B which is capable of continuously responding to changes in input signal 12. Furthermore, Stage B of equilibrium circuit 40 provides an equilibrium voltage on Node7 and Node8 between $V_{TP}$ and $V_{TN}$, so that a continuous signal is always provided to the output stage 90.

As previously discussed, the transistor threshold voltage, $V_T$, can affect the duty cycle of the incoming signal 12 and thus the skew of the PECL buffer. A 180° phase difference between the signals of the differential pair is critical for preserving signal integrity and efficiency. The present invention negates the skew effect caused by the threshold voltage $V_T$ of a transistor, discussed above. The transistor will always operate in active mode even when its input signal is below its threshold voltage, $V_T$, such that the differential pair will always respond to changes in the single-ended input signal.

The present invention is suitable for use in any applications having differential pair outputs. It is especially attractive for use in high speed applications where the elimination of skew is particularly critical to the speed and integrity of the differential signal pair. These high speed applications will typically have a small voltage swing between the differential pair so that power is conserved as well and speed is enhanced.

While the invention has been particularly shown and described with reference to a preferred embodiment, it will be understood by those skilled in the art that various changes in form and detail may be made therein without departing from the spirit and scope of the invention.

What is claimed is:

1. A buffer circuit which generates a matched-phase differential signal pair given a single-ended signal, the circuit comprising:

an input stage, having the single-ended signal as an input signal, which generates a first complementary signal pair;

an equilibrium stage, having the complementary signal pair as input signals, which creates a midpoint between the threshold voltages of a plurality of transistors of the equilibrium stage and generates a second complementary signal pair; and an output stage, having the second complementary signal pair as input signals, which produces the matched-phase differential signal pair;

wherein the midpoint created by the equilibrium stage enables the matched-phase differential signal pair to respond to changes in the single-ended signal.

2. The circuit of claim 1, wherein a first signal and a second signal of the first complementary signal pair are 180° out of phase, and a third signal and a fourth signal of the second complementary signal pair are 180° out of phase.

3. The circuit of claim 1, wherein the matched-phase differential signal pair is capable of continuously responding to changes in the single-ended signal.

4. The circuit of claim 1, wherein the input stage comprises:

a first transistor, a second transistor, a third transistor, a fourth transistor, a fifth transistor, a sixth transistor, a seventh transistor, and an eighth transistor, with each transistor having a first source/drain, a second source/drain, and a gate;

the equilibrium circuit comprises a ninth transistor, a tenth transistor, an eleventh transistor, a twelfth transistor, a thirteen transistor, a fourteenth transistor, a fifteenth transistor, a sixteenth transistor, a seventeenth transistor, an eighteenth transistor, a nineteenth transistor, a twentieth transistor, a twenty-first transistor, a twenty-second transistor, a twenty-third transistor, and a twenty-fourth transistor, with each transistor having a first source/drain, a second source/drain, and a gate;

the output stage comprises a twenty-fifth transistor, a twenty-sixth transistor, a twenty-seventh transistor, a twenty-eighth transistor, a twenty-ninth transistor, a thirtieth transistor, a thirty-first transistor, a thirty-second transistor, and a thirty-third transistor, with each transistor having a first source/drain, a second source/drain, and a gate;

wherein a first source/drain of the first transistor, a first source/drain of the fifth transistor, a first source/drain of the seventh transistor, a first source/drain of the ninth transistor, a first source/drain of the eleventh transistor, a first source/drain of the thirteenth transistor, a first source/drain of the fifteenth transistor, a first source/drain of the seventeenth transistor, a first source/drain of the nineteenth transistor, a first source/drain of the twenty-first transistor, a first source/drain of the twenty-third transistor, a first source/drain of the twenty-eighth transistor, a first source/drain of the thirty-first transistor, a gate of the third transistor, and a second source/drain of the twenty-seventh transistor are electrically connected to a first voltage potential;

wherein a second source/drain of the second transistor, a second source/drain of the sixth transistor, a second source/drain of the eighth transistor, a second source/drain of the tenth transistor, a second source/drain of the twelfth transistor, a second source/drain of the fourteenth transistor, a second source/drain of the sixteenth transistor, a second source/drain of the eighteenth transistor, a second source/drain of the twentieth transistor, a second source/drain of the twenty-second transistor, a second source/drain of the twenty-fourth transistor, a second source/drain of the twenty-ninth transistor, a second source/drain of the thirtieth transistor, a second source/drain of the thirty-second transistor, a second source/drain of the thirty-third transistor, a gate of the fourth transistor, and a first source/drain of the twenty-fifth transistor are electrically connected to a second voltage potential;

wherein the single-ended signal is applied to a gate of the first transistor, a gate of the second transistor, a gate of the fifth transistor, and a gate of the fifth transistor;

wherein a second source/drain of the first transistor is electrically connected to a first source/drain of the second transistor, a first source/drain of the third transistor, and a first source/drain of the fourth transistor; wherein a second source/drain of the fifth transistor is electrically connected to a first source/drain of the sixth transistor, a gate of the seventh transistor, and a gate of the eighth transistor;

wherein a first node is defined as the electrical connection of a second source/drain of the third transistor, a second source/drain of the fourth transistor, a gate of the tenth transistor, and a gate of the eleventh transistor;

wherein a second node is defined as the electrical connection of a second source/drain of the seventh transistor, a first source/drain of the eighth transistor, a gate of the eighteenth transistor, and a gate of the nineteenth transistor;

wherein a third node is defined as the electrical connection of a gate of the twelfth transistor, a first source/drain of the twelfth transistor, a second source/drain of the eleventh transistor, and a gate of the sixteenth transistor;

wherein a fourth node is defined as the electrical connection of a gate of the twentieth transistor, a first source/drain of the twentieth transistor, a second source/drain of the nineteenth transistor, and a gate of the twenty-fourth transistor;

wherein a fifth node is defined as the electrical connection of a gate of the ninth transistor, a second source/drain of the ninth transistor, a first source/drain of the tenth transistor, and a gate of the thirteenth transistor;

wherein a sixth node is defined as the electrical connection of a gate of the seventeenth transistor, a second source/drain of the seventeenth transistor, a first source/drain of the eighteenth transistor, and a gate of the twenty-first transistor;

wherein a seventh node is defined as the electrical connection of a second source/drain of the thirteenth transistor, a first source/drain of the fourteenth transistor, a gate of the fourteenth transistor, a gate of the fifteenth transistor, a second source/drain of the fifteenth transistor, a first source/drain of the sixteenth transistor, and a gate of the twenty-ninth transistor;

wherein an eighth node is defined as the electrical connection of a second source/drain of the twenty-first transistor, a first source/drain of the twenty-second transistor, a gate of the twenty-second transistor, a gate of the twenty-third transistor, a second source/drain of the twenty-third transistor, a first source/drain of the twenty-fourth transistor, and a gate of the thirty-second transistor;

wherein a gate of the twenty-fifth transistor is electrically connected to a second source/drain of the twenty-fifth transistor, a first source/drain of the twenty-fifth transistor; a gate of the twenty-sixth transistor is electrically connected to a gate of the twenty-seventh transistor, a second source/drain of the twenty-sixth transistor, a first source/drain of the twenty-seventh transistor, a gate of the twenty-eighth transistor, and a gate of the thirty-first transistor; and wherein a first signal of the matched-phase differential signal pair is defined as the electrical connection of a second source/drain of the twenty-eighth transistor, a first source/drain of the twenty-ninth transistor, and a first source/drain of the thirtieth transistor; and a second signal of the matched-phase differential signal pair is defined as the electrical connection of a second source/drain of the thirty-first transistor, a first source/drain of the thirty-second transistor, and a first source/drain of the thirty-third transistor.

5. The circuit of claim 4, wherein the first voltage potential is Vcc and the second voltage potential is Vss.

6. The circuit of claim 4, wherein the first transistor, the fourth transistor, the fifth transistor, the seventh transistor, the ninth transistor, the eleventh transistor, the thirteenth transistor, the fifteenth transistor, the seventeenth transistor, the nineteenth transistor, the twenty-first transistor, the twenty-third transistor, the twenty-seventh transistor, the twenty-eighth transistor, and the thirty-first transistor are p-channel transistors;

and the second transistor, the third transistor, the sixth transistor, the eighth transistor, the tenth transistor, the twelfth transistor, the fourteenth transistor, the sixteenth transistor, the eighteenth transistor, the twentieth transistor, the twenty-second transistor, the twenty-fourth transistor, the twenty-fifth transistor, the twenty-sixth transistor, the twenty-ninth transistor, the thirtieth transistor, the thirty-second transistor, and the thirty-third transistor are n-channel transistors.

7. A buffer circuit which generates a matched-phase differential signal pair given a single-ended signal, the circuit comprising:

an input stage, having the single-ended signal as an input signal, which generates a first complementary signal pair, wherein the input stage comprises a first transistor, a second transistor, a third transistor, a fourth transistor, a fifth transistor, a sixth transistor, a seventh transistor, and an eighth transistor, with each transistor having a first source/drain, a second source/drain, and a gate;

an equilibrium stage, having the complementary signal pair as input signals, which creates a midpoint between the threshold voltages of a plurality of transistors of the equilibrium stage and generates a second complementary signal pair, wherein the equilibrium circuit comprises a ninth transistor, a tenth transistor, an eleventh transistor, a twelfth transistor, a thirteen transistor, a fourteenth transistor, a fifteenth transistor, a sixteenth transistor, a seventeenth transistor, an eighteenth transistor, a nineteenth transistor, a twentieth transistor, a twenty-first transistor, a twenty-second transistor, a twenty-third transistor, and a twenty-fourth transistor, with each transistor having a first source/drain, a second source/drain, and a gate; and an output stage, having the second complementary signal pair as input signals, which produces the matched-phase differential signal pair, wherein the output stage comprises a twenty-fifth transistor, a twenty-sixth transistor, a twenty-seventh transistor, a twenty-eighth transistor, a twenty-ninth transistor, a thirtieth transistor, a thirty-first transistor, a thirty-second transistor, and a thirty-third transistor, with each transistor having a first source/drain, a second source/drain, and a gate;

wherein the midpoint created by the equilibrium stage enables the matched-phase differential signal pair to respond to changes in the single-ended signal;

wherein a first source/drain of the first transistor, a first source/drain of the fifth transistor, a first source/drain of the seventh transistor, a first source/drain of the ninth transistor, a first source/drain of the eleventh transistor, a first source/drain of the thirteenth transistor, a first source/drain of the fifteenth transistor, a first source/drain of the seventeenth transistor, a first source/drain of the nineteenth transistor, a first source/drain of the twenty-first transistor, a first source/drain of the twenty-third transistor, a first source/drain of the twenty-eighth transistor, a first source/drain of the thirty-first transistor, a gate of the third transistor, and a second source/drain of the twenty-seventh transistor are electrically connected to a first voltage potential;

wherein a second source/drain of the second transistor, a second source/drain of the sixth transistor, a second source/drain of the eighth transistor, a second source/drain of the tenth transistor, a second source/drain of the twelfth transistor, a second source/drain of the fourteenth transistor, a second source/drain of the sixteenth transistor, a second source/drain of the eighteenth transistor, a second source/drain of the twentieth transistor, a second source/drain of the twenty-second transistor, a second source/drain of the twenty-fourth transistor, a second source/drain of the twenty-ninth transistor, a second source/drain of the thirtieth transistor, a second source/drain of the thirty-second transistor, a second source/drain of the thirty-third transistor, a gate of the fourth transistor, and a first source/drain of the twenty-fifth transistor are electrically connected to a second voltage potential;

wherein the single-ended signal is applied to a gate of the first transistor, a gate of the second transistor, a gate of the fifth transistor, and a gate of the fifth transistor;

wherein a second source/drain of the first transistor is electrically connected to a first source/drain of the second transistor, a first source/drain of the third transistor, and a first source/drain of the fourth transistor; wherein a second source/drain of the fifth transistor is electrically connected to a first source/drain of the sixth transistor, a gate of the seventh transistor, and a gate of the eighth transistor;

wherein a first node is defined as the electrical connection of a second source/drain of the third transistor, a second source/drain of the fourth transistor, a gate of the tenth transistor, and a gate of the eleventh transistor;

wherein a second node is defined as the electrical connection of a second source/drain of the seventh transistor, a first source/drain of the eighth transistor, a gate of the eighteenth transistor, and a gate of the nineteenth transistor;

wherein a third node is defined as the electrical connection of a gate of the twelfth transistor, a first source/drain of the twelfth transistor, a second source/drain of the eleventh transistor, and a gate of the sixteenth transistor;

wherein a fourth node is defined as the electrical connection of a gate of the twentieth transistor, a first source/drain of the twentieth transistor, a second source/drain of the nineteenth transistor, and a gate of the twenty-fourth transistor;

wherein a fifth node is defined as the electrical connection of a gate of the ninth transistor, a second source/drain of the ninth transistor, a first source/drain of the tenth transistor, and a gate of the thirteenth transistor;

wherein a sixth node is defined as the electrical connection of a gate of the seventeenth transistor, a second source/drain of the seventeenth transistor, a first source/drain of the eighteenth transistor, and a gate of the twenty-first transistor;

wherein a seventh node is defined as the electrical connection of a second source/drain of the thirteenth transistor, a first source/drain of the fourteenth transistor, a gate of the fourteenth transistor, a gate of the fifteenth transistor, a second source/drain of the fifteenth transistor, a first source/drain of the sixteenth transistor, and a gate of the twenty-ninth transistor;

wherein an eighth node is defined as the electrical connection of a second source/drain of the twenty-first transistor, a first source/drain of the twenty-second transistor, a gate of the twenty-second transistor, a gate of the twenty-third transistor, a second source/drain of the twenty-third transistor, a first source/drain of the twenty-fourth transistor, and a gate of the thirty-second transistor;

wherein a gate of the twenty-fifth transistor is electrically connected to a second source/drain of the twenty-fifth transistor, a first source/drain of the twenty-fifth transistor; a gate of the twenty-sixth transistor is electrically connected to a gate of the twenty-seventh transistor, a second source/drain of the twenty-sixth transistor, a first source/drain of the twenty-seventh transistor, a gate of the twenty-eighth transistor, and a gate of the thirty-first transistor; and wherein a first signal of the matched-phase differential signal pair is defined as the electrical connection of a second source/drain of the twenty-eighth transistor, a first source/drain of the twenty-ninth transistor, and a first source/drain of the thirtieth transistor; and a second signal of the matched-phase differential signal pair is defined as the electrical connection of a second source/drain of the thirty-first transistor, a first source/drain of the thirty-second transistor, and a first source/drain of the thirty-third transistor.

8. The circuit of claim 7, wherein a first signal and a second signal of the first complementary signal pair are 180° out of phase, and a third signal and a fourth signal of the second complementary signal pair are 180° out of phase.

9. The circuit of claim 7, wherein the matched-phase differential signal pair is capable of continuously responding to changes in the single-ended signal.

10. The circuit of claim 7, wherein the first voltage potential is Vcc and the second voltage potential is Vss.

11. The circuit of claim 7, wherein the first transistor, the fourth transistor, the fifth transistor, the seventh transistor, the ninth transistor, the eleventh transistor, the thirteenth transistor, the fifteenth transistor, the seventeenth transistor, the nineteenth transistor, the twenty-first transistor, the twenty-third transistor, the twenty-seventh transistor, the twenty-eighth transistor, and the thirty-first transistor are p-channel transistors;

and the second transistor, the third transistor, the sixth transistor, the eighth transistor, the tenth transistor, the twelfth transistor, the fourteenth transistor, the sixteenth transistor, the eighteenth transistor, the twentieth transistor, the twenty-second transistor, the twenty-fourth transistor, the twenty-fifth transistor, the twenty-sixth transistor, the twenty-ninth transistor, the thirtieth transistor, the thirty-second transistor, and the thirty-third transistor are n-channel transistors.

12. A method for generating a matched-phase differential signal pair given a first single-ended signal, comprising the steps of:

duplicating the first single-ended signal to create a second single-ended signal;

inverting the second single-ended signal such that the first single-ended signal and the second single-ended signal are 180° out of phase; and creating a midpoint between the threshold voltages of a plurality of transistors, such that a matched-phase differential signal pair is capable of responding to changes in the single-ended signal.

13. The method of claim 12, wherein a first signal and a second signal of the matched-phase differential signal pair are 180° out of phase.

14. The method of claim 12, wherein the matched-phase differential signal pair is capable of continuously responding to changes in the single-ended signal.

15. The method of claim 12, wherein the step of duplicating the first single-ended signal to create the second single-ended signal and inverting the second single-ended signal is accomplished by an input stage of a buffer circuit; the step of creating the midpoint between the threshold voltages of the plurality of transistors, such that the matched-phase differential signal pair is capable of responding to changes in the single-ended signal, is accomplished by an equilibrium circuit of the buffer circuit; and the matched-phase differential signal pair is produced by an output stage of the buffer circuit.

16. The method of claim 15, wherein the input stage comprises:

a first transistor, a second transistor, a third transistor, a fourth transistor, a fifth transistor, a sixth transistor, a seventh transistor, and an eighth transistor, with each transistor having a first source/drain, a second source/drain, and a gate;

the equilibrium circuit comprises a ninth transistor, a tenth transistor, an eleventh transistor, a twelfth transistor, a thirteen transistor, a fourteenth transistor, a fifteenth transistor, a sixteenth transistor, a seventeenth transistor, an eighteenth transistor, a nineteenth transistor, a twentieth transistor, a twenty-first transistor, a twenty-second transistor, a twenty-third transistor, and a twenty-fourth transistor, with each transistor having a first source/drain, a second source/drain, and a gate;

the output stage comprises a twenty-fifth transistor, a twenty-sixth transistor, a twenty-seventh transistor, a twenty-eighth transistor, a twenty-ninth transistor, a thirtieth transistor, a thirty-first transistor, a thirty-second transistor, and a thirty-third transistor, with each transistor having a first source/drain, a second source/drain, and a gate;

wherein a first source/drain of the first transistor, a first source/drain of the fifth transistor, a first source/drain of the seventh transistor, a first source/drain of the ninth transistor, a first source/drain of the eleventh transistor, a first source/drain of the thirteenth transistor, a first source/drain of the fifteenth transistor, a first source/drain of the seventeenth transistor, a first source/drain of the nineteenth transistor, a first source/drain of the twenty-first transistor, a first source/drain of the twenty-third transistor, a first source/drain of the twenty-eighth transistor, a first source/drain of the thirty-first transistor, a gate of the third transistor, and a second source/drain of the twenty-seventh transistor are electrically connected to a first voltage potential;

wherein a second source/drain of the second transistor, a second source/drain of the sixth transistor, a second source/drain of the eighth transistor, a second source/drain of the tenth transistor, a second source/drain of the twelfth transistor, a second source/drain of the fourteenth transistor, a second source/drain of the sixteenth transistor, a second source/drain of the eighteenth transistor, a second source/drain of the twentieth transistor, a second source/drain of the twenty-second transistor, a second source/drain of the twenty-fourth transistor, a second source/drain of the twenty-ninth transistor, a second source/drain of the thirtieth transistor, a second source/drain of the thirty-second transistor, a second source/drain of the thirty-third transistor, a gate of the fourth transistor, and a first source/drain of the twenty-fifth transistor are electrically connected to a second voltage potential;

wherein the single-ended signal is applied to a gate of the first transistor, a gate of the second transistor, a gate of the fifth transistor, and a gate of the fifth transistor;

wherein a second source/drain of the first transistor is electrically connected to a first source/drain of the second transistor, a first source/drain of the third transistor, and a first source/drain of the fourth transistor; wherein a second source/drain of the fifth transistor is electrically connected to a first source/drain of the sixth transistor, a gate of the seventh transistor, and a gate of the eighth transistor;

wherein a first node is defined as the electrical connection of a second source/drain of the third transistor, a second source/drain of the fourth transistor, a gate of the tenth transistor, and a gate of the eleventh transistor;

wherein a second node is defined as the electrical connection of a second source/drain of the seventh transistor, a first source/drain of the eighth transistor, a gate of the eighteenth transistor, and a gate of the nineteenth transistor;

wherein a third node is defined as the electrical connection of a gate of the twelfth transistor, a first source/drain of the twelfth transistor, a second source/drain of the eleventh transistor, and a gate of the sixteenth transistor;

wherein a fourth node is defined as the electrical connection of a gate of the twentieth transistor, a first source/drain of the twentieth transistor, a second source/drain of the nineteenth transistor, and a gate of the twenty-fourth transistor;

wherein a fifth node is defined as the electrical connection of a gate of the ninth transistor, a second source/drain of the ninth transistor, a first source/drain of the tenth transistor, and a gate of the thirteenth transistor;

wherein a sixth node is defined as the electrical connection of a gate of the seventeenth transistor, a second source/drain of the seventeenth transistor, a first source/drain of the eighteenth transistor, and a gate of the twenty-first transistor;

wherein a seventh node is defined as the electrical connection of a second source/drain of the thirteenth transistor, a first source/drain of the fourteenth transistor, a gate of the fourteenth transistor, a gate of the fifteenth transistor, a second source/drain of the fifteenth transistor, a first source/drain of the sixteenth transistor, and a gate of the twenty-ninth transistor;

wherein an eighth node is defined as the electrical connection of a second source/drain of the twenty-first transistor, a first source/drain of the twenty-second transistor, a gate of the twenty-second transistor, a gate of the twenty-third transistor, a second source/drain of the twenty-third transistor, a first source/drain of the twenty-fourth transistor, and a gate of the thirty-second transistor;

wherein a gate of the twenty-fifth transistor is electrically connected to a second source/drain of the twenty-fifth transistor, a first source/drain of the twenty-fifth transistor; a gate of the twenty-sixth transistor is electrically connected to a gate of the twenty-seventh transistor, a second source/drain of the twenty-sixth transistor, a first source/drain of the twenty-seventh transistor, a gate of the twenty-eighth transistor, and a gate of the thirty-first transistor; and wherein a first signal of the matched-phase differential signal pair is defined as the electrical connection of a second source/drain of the twenty-eighth transistor, a first source/drain of the twenty-ninth transistor, and a first source/drain of the thirtieth transistor; and a second signal of the matched-phase differential signal pair is defined as the electrical connection of a second source/drain of the thirty-first transistor, a first source/drain of the thirty-second transistor, and a first source/drain of the thirty-third transistor.

17. The method of claim 16, wherein the first voltage potential is Vcc and the second voltage potential is Vss.

18. The method of claim 16, wherein the first transistor, the fourth transistor, the fifth transistor, the seventh transistor, the ninth transistor, the eleventh transistor, the thirteenth transistor, the fifteenth transistor, the seventeenth transistor, the nineteenth transistor, the twenty-first transistor, the twenty-third transistor, the twenty-seventh transistor, the twenty-eighth transistor, and the thirty-first transistor are p-channel transistors;

and the second transistor, the third transistor, the sixth transistor, the eighth transistor, the tenth transistor, the twelfth transistor, the fourteenth transistor, the sixteenth transistor, the eighteenth transistor, the twentieth transistor, the twenty-second transistor, the twenty-fourth transistor, the twenty-fifth transistor, the twenty-sixth transistor, the twenty-ninth transistor, the thirtieth transistor, the thirty-second transistor, and the thirty-third transistor are n-channel transistors.

* * * * *